United States Patent [19]

Benasutti

[11] Patent Number: 4,530,551
[45] Date of Patent: Jul. 23, 1985

[54] CIRCUIT CHANGE PIN FOR PRINTED WIRING BOARD

[75] Inventor: John E. Benasutti, North Wales, Pa.

[73] Assignee: Burroughs Corp., Detroit, Mich.

[21] Appl. No.: 570,201

[22] Filed: Jan. 12, 1984

[51] Int. Cl.³ .................... H05K 1/00; H01R 13/50
[52] U.S. Cl. ............................ 339/17 C; 339/214 R
[58] Field of Search ............ 339/17 C, 214 R, 214 C, 339/214 S, 215 R, 215 S, 130 R, 130 C, 217 R, 217 J, 217 PS, 217 SP, 217 TP, 278 T

[56] References Cited

U.S. PATENT DOCUMENTS

| | | | |
|---|---|---|---|
| 2,962,691 | 11/1960 | Mande et al. | 339/214 R |
| 3,162,500 | 12/1964 | Pittman | 339/18 R |
| 3,569,918 | 3/1971 | Arnold | 339/217 PS |
| 3,850,501 | 11/1974 | Butterfield et al. | 339/215 R |
| 4,354,725 | 10/1982 | Herbaugh et al. | 339/214 R |

Primary Examiner—Gil Weidenfeld
Assistant Examiner—Gary F. Paumen
Attorney, Agent, or Firm—Francis A. Varallo; Mervin L. Young; Kevin R. Peterson

[57] ABSTRACT

The present disclosure describes an insulated electrical contact pin for use in making wiring changes in an interconnection medium such as a printed circuit board or backplane. More specifically, the present pin replaces the original compliant press-fit type pin mounted in a plated-through hole on the board. The pin is formed in two sections—one section having a threaded extremity, and the other, a tapped bore to receive the former. The pin is mounted in a plated-through hole on the printed wiring board by screwing the two sections together. Portions of the pin sections are electrically insulated from the wiring traces situated on or below the board surface. The present contact pin is versatile, easy to install and tolerance-free with respect to the dimensions of the plated-through hole in which it is mounted.

4 Claims, 2 Drawing Figures

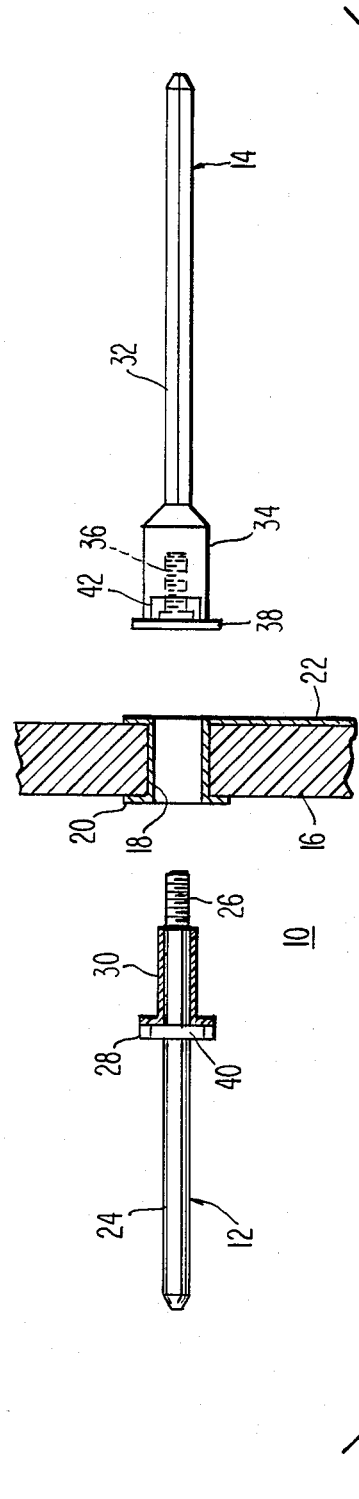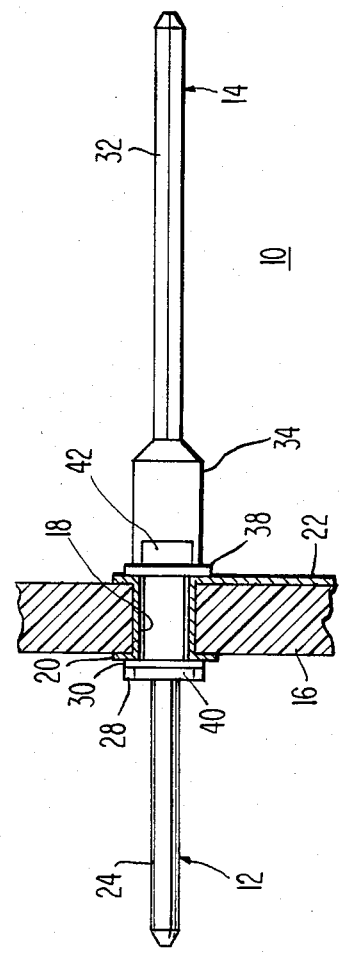

CIRCUIT CHANGE PIN FOR PRINTED WIRING BOARD

CROSS REFERENCE TO RELATED APPLICATION

To the extent that copending application Ser. No. 431,909, Filed Sept. 30, 1982, entitled "Interconnection Medium—Change Pin Assembly" by Robert E. Braun and John E. Benasutti includes a partially insulated change pin which cooperates with an interconnection medium in performing circuit modifications, it is referenced herein. Both the latter application and the present one are assigned to the same assignee.

BACKGROUND OF THE INVENTION

The electrical wiring of large scale electronic equipment such as a computer usually involves a central wiring panel or backplane. The latter represents an interconnection medium of the printed wiring board type. Individual printing wiring boards containing the electronic components that comprise the active circuits are connected to the backplane. The latter is accomplished by providing connectors on the backplane in order that the printed wiring boards may be removed and replaced as desired. A well known method used to connect the connector contacts to the backplane is to press the connector contact pins into plated-through holes formed in the backplane. The plated material surrounding the holes is electrically connected to printed wiring leads or traces on or below the surface of the backplane. The connector contact pins are commonly of the compliant-type having a spring-like section that engages the walls of the plated-through hole, thereby providing solderless electrical connection to the backplane.

Situations often exist in electronic design where a circuit change requiring disconnection of electrical paths and rewiring are to be included into the completed equipment. Obviously, it is advantageous to make the required circuit changes without revising the backplane printed wiring board. In the referenced copending application, a change pin having a unitary body member and an insulative sleeve disposed about a substantially medial portion thereof is inserted into a plated-through hole to effectively insolate the printed wiring associated with the latter. As noted in the application, the change pin is retained in the board by a press fit action. Also, it was noted that a family of change pins may be required to function over the tolerance range of the back plane via holes. The circuit change procedure, in this case would involve removing the original compliant pin and gauging the hole with a plug gauge. Then, the proper insulated change pin could be selected and press fitted into the hole.

While the above procedure represents a practical and workable solution to the circuit change problem, it is desirable to have a single wiring change pin of such a design that is universal, easy to install, and tolerance-free as to the dimensions of the circuit board plated-through holes. The change pin of the present invention fills such a need.

SUMMARY OF THE INVENTION

In accordance with the present invention, there is provided a change pin having an elongated body member which is separable into two body parts.

The first body part, which has a generally circular cross section shaft suitable for engaging a corresponding connector contact, is threaded at one extremity. A shoulder is provided on the shaft at a predetermined distance from the start of the threaded section. Electrically insulative material is disposed along the shaft for the last mentioned distance and also covers the shoulder surface contiguous therewith.

The second body part which has a generally rectangular cross section shaft suitable for wrapped wire connections, has an enlarged section of generally circular cross section at one extremity. The latter section has a central bore, tapped to receive the threaded extremity of the first body part. Electrically insulative material is disposed on the outer edge of the enlarged section.

In installing the present change pin, the threaded section of the first part and its adjacent section up to the shoulder is inserted into a plated-through hole in a printed circuit board. The tapped section of the second body part is brought into engagement with the threaded section, and the two body parts are screwed together. Flats on the respective shoulder and enlarged sections of the body parts enable the application of increased torque during the latter operation. The insulating material prevents any electrical contact of the change pin with the plated material within the hole or the pads and traces on the board surface associated therewith. In effect, the pin is isolated from the previously designed circuit paths and may be utilized for the desired wiring change. One such change which may be made, involves the need in completed equipment for an additional signal path where no pins on the backplane are available. In this case, on of the compliant pins associated with a power source, such as a ground connection, may be extracted and the change pin of the present invention substituted therefor. A discrete wire connection may then be made to the isolated pin to establish the signal path.

Other features and advantages of the present invention will become apparent in the detailed description thereof which follows:

BRIEF DESCRIPTION OF THE DRAWING

FIG. 1 illustrates the two body parts which comprise the present change pin, prior to their installation in a printed circuit board.

FIG. 2 illustrates the change pin of the present invention installed in a plated-through hole of the board.

DESCRIPTION OF THE PREFERRED EMBODIMENT

With reference to FIG. 1, the wiring change pin 10 is shown separated into two body parts, namely 12 and 14. A small portion of a printed wiring board 16 having a plated-through hole 18 for receiving the pin 10 is shown between the body parts. Electrically conductive material 20 is disposed within the hole 18 and forms pads on the outer surfaces of the board 16. A printed trace 22 is also illustrated.

Body part 12 has a generally circular cross section shaft 24 thereby eliminating any need for orientation with respect to the connector contact (not shown) which it is adapted to engage. A screw thread 26 is formed at one extremity of the shaft 24. A cylindrical shoulder 28 is provided at a predetermined distance from the start of the thread 26. This distance is a function of the thickness of board 16. Electrically insulative material, which may take the form of a sleeve 30 is disposed on the portion of the shaft 24 between the shoulder 28 and the thread 26, and covers the surface of the shoulder 28 adjacent thereto.

Body part 14 has a generally rectangular cross section shaft 32 as required by wire wrapping processes. An enlarged section 34 of generally circular cross section is provided at one extremity of shaft 32. The latter section 34 has a central bore 36, tapped to receive the thread 26 of part 12. Electrically insulative material which may be in the form of a washer 38 may be employed at one end of section 34. In practice, the washer 38 may be placed over thread 26 during mounting of the pin 10, or it may be affixed to the end of section 34 beforehand with a suitable adhesive.

With continued reference to FIG. 1 and additional reference to FIG. 2, installation of the change pin 10 in board 16 is readily accomplished as follows. The thread 26 and the adjacent insulated portion of shaft 24 up to shoulder 28 is inserted into hole 18. The thread 26 is introduced into the tapped bore 36 of section 34 and the two body parts 12 and 14 are screwed together. Flats 40 and 42 on the respective shoulder 28 and enlarged section 34 assist in the application of the required torque. As seen particularly in FIG. 2, the change pin 10 is electrically isolated from the metallic surfaces 20 and trace 22 associated with hole 18, by virtue of the insulated material 30 on the pin 10.

It should be noted that the shoulder 28 and enlarged section 34 provide retention of the pin 10 in the hole 18 and prevent pin push out during wiring or connector engagement or disengagement. In an actual operative system, the plated-through hole size for the original compliant press fit contact pin is 0.040+/−0.003 inches. Accordingly, the screw thread 26 for the change pin 10 may be a size 000-120 which has a 0.034 inch diameter and 120 threads per inch. However, the present invention should not be considered limited thereto. For example, screw thread size 0000-160 which is 0.021 inches in diameter, 160 threads per inch may be used for smaller printed wiring board hole sizes. The important advantage of the present invention is that, given a particular plated-through hole size, such as 0.040 inches, tolerance shifts of +/−0.003 inches have no effect on the change pin designed for use with the nominal hole size.

In conclusion, there has been disclosed a wiring change pin characterized in that the application of the aforementioned minature screw threads which are not commonly used in the electronics interconnection industry, and their use in a separable contact, facilitates circuit modifications in completed equipment. It is apparant that depending upon the particular application, changes and modifications of the pin may be required. Such changes and modifications insofar as they are not departures from the true scope of the invention, are intended to be covered by the claims which follow.

What is claimed is:

1. A wiring change pin assembly comprising in combination:
  a printed wiring board of predetermined thickness and having at least one plated-through hole,
  an elongated body member comprised of a pair of separable body parts,
  one of said body parts including a first shaft adapted to mate with an electrical connector, said first shaft having a threaded section at one extremity thereof, a shoulder formed on said first shaft, an intermediate portion of said first shaft situated between said shoulder and said threaded section, electrically insulative material disposed on said intermediate portion and on the surface of said shoulder contiguous with said intermediate portion of said first shaft, the length of said intermediate portion of said shaft being a function of said predetermined thickness of said printed wiring board, said threaded section and said intermediate portion of said first shaft being inserted into said plated-through hole, the cross-sectional dimension of said shoulder being greater than the diameter of said plated-through hole,
  the other of said body parts including a second shaft adapted to have a wire wrapped thereabout, said second shaft having an enlarged section at one extremity thereof, said enlarged section having a central bore, electrically insulative material disposed on the edge of said enlarged section surrounding the opening of said bore, the cross-sectional dimension of said enlarged section being greater than the diameter of said plated-through hole, said bore being tapped to accommodate said threaded section of said first shaft, whereby said body parts are screwed together to effect the mounting of said enlongated body member on said printed wiring board, and wherein the insulated surface of said shoulder of said first shaft and the insulated edge of said enlarged section of said second shaft firmly contact respective opposed surfaces of said printed wiring board.

2. A wiring change pin as defined in claim 1 characterized in that said first shaft including said shoulder has a substantially circular cross section and said second shaft excluding said enlarged section has a substantially rectangular cross section.

3. A wiring change pin as defined in claim 2 further characterized in that said enlarged section of said second shaft has a substantially circular cross section.

4. A wiring change pin as defined in claim 3 wherein both said shoulder and said enlarged section include respective flat areas on the surfaces thereof in order to increase the torque which may be applied to said body parts in screwing them to each other.

* * * * *